United States Patent
Rajaee et al.

(10) Patent No.: US 10,277,241 B1
(45) Date of Patent: Apr. 30, 2019

(54) CONTINUOUS-TIME ANALOG-TO-DIGITAL CONVERTER

(71) Applicant: QUALCOMM Incorporated, San Diego, CA (US)

(72) Inventors: Omid Rajaee, San Diego, CA (US); Elias Dagher, Laguna Niguel, CA (US); Yan Wang, San Diego, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/961,631

(22) Filed: Apr. 24, 2018

(51) Int. Cl.
| | | |
|---|---|---|
| *H03M 1/18* | (2006.01) | |
| *H03M 1/66* | (2006.01) | |
| *H03M 3/00* | (2006.01) | |

(52) U.S. Cl.
CPC ............. *H03M 1/181* (2013.01); *H03M 1/66* (2013.01); *H03M 3/37* (2013.01); *H03M 3/30* (2013.01); *H03M 3/374* (2013.01); *H03M 3/454* (2013.01); *H03M 3/458* (2013.01)

(58) Field of Classification Search
CPC .......... H03M 3/30; H03M 3/37; H03M 3/374; H03M 3/454; H03M 3/45; H03M 1/66; H03M 1/181
USPC .................................................. 341/143, 155
See application file for complete search history.

(56) References Cited

U.S. PATENT DOCUMENTS

| | | |
|---|---|---|
| 6,414,615 B1 | 7/2002 | Cheng |
| 7,317,411 B1 | 1/2008 | Nanda et al. |
| 7,365,667 B1 | 4/2008 | Nanda et al. |
| 7,382,300 B1 | 6/2008 | Nanda et al. |
| 7,948,412 B2 | 5/2011 | Aiba |
| 8,072,362 B2 | 12/2011 | Lin et al. |
| 8,130,127 B1 | 3/2012 | Tsang et al. |
| 8,400,340 B2 | 3/2013 | Mishra et al. |
| 8,514,117 B2 | 8/2013 | Srinivasan et al. |
| 8,542,138 B2 | 9/2013 | Galton et al. |

(Continued)

OTHER PUBLICATIONS

Afifi M et al: "A Study of Excess Loop Delay in Tunable Continuous-Time Bandpass Delta-Sigma Modulators Using RC-Resonators," Analog Integrated Circuits and Signal Processing, Springer New York LLC, US, vol. 79, No. 3, Apr. 10, 2014 (Apr. 10, 2014), XP035317586, pp. 555-568, ISSN: 0925-1030, DOI: 10.1007/S10470-014-0294-0 [retrieved on Apr. 10, 2014].

(Continued)

*Primary Examiner* — Khai M Nguyen (74) *Attorney, Agent, or Firm* — Seyfarth Shaw LLP (57) ABSTRACT

A continuous-time analog-to-digital converter (ADC) includes a plurality of integrators selectively coupled in series. The ADC may further include a quantizer with excess loop delay (ELD) compensation. The quantizer may be coupled in series to a least one integrator. The ELD compensation may be programmable based on a transfer function of the ADC. The ADC may further include parallel digital-to-analog converters (DACs). Each DAC may have an input coupled to an output of the quantizer, and an output coupled to an input of a corresponding integrator. The ADC may further include a bypass path coupled to an input or output of one of the integrators. The bypass path may be configured to selectively bypass one or more of the integrators to change the transfer function of the ADC.

23 Claims, 8 Drawing Sheets

(56) References Cited

U.S. PATENT DOCUMENTS

| | | | | |
|---|---|---|---|---|
| 8,552,894 | B2* | 10/2013 | Huang | H03M 3/438 |
| | | | | 341/143 |
| 8,638,251 | B1 | 1/2014 | Hong et al. | |
| 8,760,331 | B2 | 6/2014 | Kaald | |
| 9,106,211 | B2 | 8/2015 | Wiesbauer et al. | |
| 9,325,341 | B2 | 4/2016 | Dagher et al. | |
| 9,455,737 | B1 | 9/2016 | Rajaee et al. | |
| 9,559,719 | B1 | 1/2017 | Kauffman et al. | |
| 9,948,318 | B1* | 4/2018 | Tsai | H03M 3/322 |
| 2007/0040718 | A1 | 2/2007 | Lee | |
| 2010/0066422 | A1 | 3/2010 | Tsai | |
| 2012/0112936 | A1 | 5/2012 | Huang | |
| 2013/0214951 | A1 | 8/2013 | Ho et al. | |
| 2016/0233872 | A1 | 8/2016 | Wei et al. | |
| 2016/0365870 | A1 | 12/2016 | Huang et al. | |
| 2018/0241409 | A1 | 8/2018 | Dagher et al. | |

OTHER PUBLICATIONS

Vikas Singh et al: "Compensating for Quantizer Delay in Excess of One Clock Cycle in Continuous-Time Delta Sigma Modulators," IEEE Transactions on Circuits and Systems II: Express Briefs, IEEE, US, vol. 57, No. 9, Sep. 2010 (Sep. 2010), XP011318487, pp. 676-680, ISSN: 1549-7747.

Vishal Saxena et al: "Reconfigurable Continuous-Time Delta-Sigma Analog-to-Digital Converters for Software-Defined and Multi-Standard Radios," Proceedings of the SDR 11 Technical Conference and Product Exposition, Nov. 29, 2011 (Nov. 29, 2011), XP55474295, pp. 249-258, Retrieved from the Internet: URL:http://www.wirelessinnovation.org/assets/Proceedings/2011/2011-6a-saxena.pdf [retrieved on May 11, 2018].

Singh V., et al., "A 16MHz BW 75 dB DR CT ΔΣ ADC Compensated for More Than One Cycle Excess Loop Delay," IEEE Journal of Solid-State Circuits, Aug. 2012, vol. 47, No. 8, pp. 1884-1895.

* cited by examiner

CONTINUOUS-TIME ANALOG-TO-DIGITAL CONVERTER

TECHNICAL FIELD

The present disclosure generally relates to electronic circuits and, more particularly, to a continuous-time delta-sigma analog-to-digital converter (CTDS ADC).

BACKGROUND

Different types of analog-to-digital converters (ADCs) are available for converting an analog signal into a digital signal. For example, a continuous-time delta-sigma modulating (CTDSM) ADC uses a delta-sigma modulator for converting an analog signal to a digital signal. The CTDSM ADC may use a loop filter for moving low frequency quantization noise up to higher frequencies outside a band of interest. The out-of-band noise may then be filtered out, which may improve a dynamic range of the analog-to-digital conversion.

A quantizer in the delta-sigma modulator may receive the output of the loop filter and perform the analog-to-digital conversion for outputting a digital signal. A feedback loop of the CTDSM ADC includes digital-to-analog converters (DACs) that convert the digital output of the quantizer to corresponding analog values. The analog values are then subtracted from the input signal of the loop filter or internal nodes within the loop filter, and the resulting signal is input back into the loop filter and then the quantizer.

One drawback of continuous-time delta-sigma modulating (CTDSM) ADCs is that their power/frequency scaling is not as robust as discrete time (DT) DSM ADCs. For example, a CT DSM ADC in 28 nanometer radio frequency exhibits similar power consumption as its DT counterpart in a LTE 40 bandwidth mode, but it burns more than twice the power compared to the DT DSM ADC when operating in a global system for mobile communications (GSM) bandwidth (BW) mode. This is an important distinction for CT DSM ADCs used in baseband receivers because they support multiple standards with wide bandwidth variations. Therefore, there is a desire for a CT DSM ADC with improved power/frequency scaling.

SUMMARY

A continuous-time analog-to-digital converter (ADC) includes a plurality of integrators selectively coupled in series. The ADC may further include a quantizer with excess loop delay (ELD) compensation. The quantizer may be coupled in series to a least one integrator. The ELD compensation may be programmable based on a transfer function of the ADC. The ADC may further include parallel digital-to-analog converters (DACs). Each DAC may have an input coupled to an output of the quantizer, and an output coupled to an input of a corresponding integrator. The ADC may further include at least one bypass path coupled to an input or output of one of the integrators. The bypass path may be configured to selectively bypass one or more of the integrators to change the transfer function of the ADC.

A method of generating a signal from a continuous-time delta-sigma analog-to-digital converter (CTDS ADC) includes bypassing at least one integrator coupled in series with other integrators. The method may further include generating at least one local feedback coefficient using a quantizer with excess loop delay (ELD) compensation based on the bypassing.

A continuous-time analog-to-digital converter (ADC), may include means for integrating coupled in series. The ADC may further include means for quantizing with excess loop delay (ELD) compensation coupled in series to the integrating means. The quantizing means may be programmable based on a transfer function of the ADC. The ADC may further include means for converting. The converting means may be coupled to the quantizing means and the integrating means. The ADC may further include means for bypassing coupled to the integrating means. The bypassing means may be configured to selectively bypass some of the integrating means to change the transfer function of the ADC.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

The techniques described herein may be used in combination with various wireless technologies such as code division multiple access (CDMA), orthogonal frequency division multiplexing (OFDM), time division multiple access (TDMA), spatial division multiple access (SDMA), single carrier frequency division multiple access (SC-FDMA), time division synchronous code division multiple access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, wideband-CDMA (W-CDMA), or some other standards. An OFDM system may implement Institute of Electrical and Electronics Engineers (IEEE) 802.11, IEEE 802.16 (WiMAX), long term evolution (LTE) (e.g., in time division duplex (TDD) and/or frequency division duplex (FDD) modes), 5G or some other standards. A TDMA system may implement global system for mobile communications (GSM) or some other standards. These various standards are known in the art.

Wireless communication networks are widely deployed for providing various communication services such as telephony, video, data, messaging, broadcasts, and so on. Such networks, which are usually multiple access networks, support communications for multiple users by sharing the available network resources. Such multiple access networks may include CDMA systems, TDMA systems, frequency division multiple access (FDMA) systems, orthogonal FDMA (OFDMA) systems, single-carrier FDMA (SC-FDMA) networks, 3$^{rd}$ Generation Partnership Project (3GPP) LTE networks, LTE-Advanced (LTE-A) networks, and 5th generation (5G) wireless systems.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

MSs and/or BSs may include an analog-to-digital converter (ADC) in the receive path (also referred to as a "receive chain") of a radio frequency front-end. The ADC may be used for converting received radio frequency (RF) signals down-converted to baseband signals, filtered, and otherwise processed into digital signals for further signal processing in the digital domain. One example type of ADC suitable for this type of conversion is a continuous-time delta-sigma modulating (CTDSM) ADC.

A continuous-time delta-sigma modulating (CTDSM) ADC uses a delta-sigma modulator to convert an analog signal to a digital signal. The CTDSM ADC may use a loop filter to move low frequency quantization noise up to higher frequencies outside the band of interest. The out-of-band noise may then be filtered out, which may improve a dynamic range of the analog-to-digital conversion.

A quantizer in the delta-sigma modulator may receive the output of the loop filter and perform the analog-to-digital conversion to output a digital signal. A feedback loop of the CTDSM ADC includes digital-to-analog converters (DACs) that convert the digital output of the quantizer to corresponding analog values. The analog values are then subtracted from the input signal of the loop filter or internal nodes within the loop filter, and the resulting signal is input back into the loop filter and then the quantizer.

One drawback of continuous-time (CT) ADCs is that their power/frequency scaling is not as robust as discrete time (DT) ADCs. For example, a CT ADC in 28 nanometer radio frequency exhibits similar power consumption as its DT counterpart in a LTE 40 bandwidth mode, but it burns more than twice the power compared to the DT ADC when operating in a global system for mobile communications (GSM) bandwidth (BW) mode. This is an important distinction for CT ADCs used in baseband receivers because they support multiple standards with wide bandwidth variations.

According to aspects of the present disclosure, a CT ADC may be robustly reconfigured from higher orders to lower orders, and vice versa, when switching between different standards. This allows improved power consumption for different standards because some of the integrators/active components of the CT ADC can be shut down when lower bandwidth is used. In addition, to order programmability, excess loop delay (ELD) compensation of the proposed CT ADC is programmable for improving loop stability.

Figure 1:
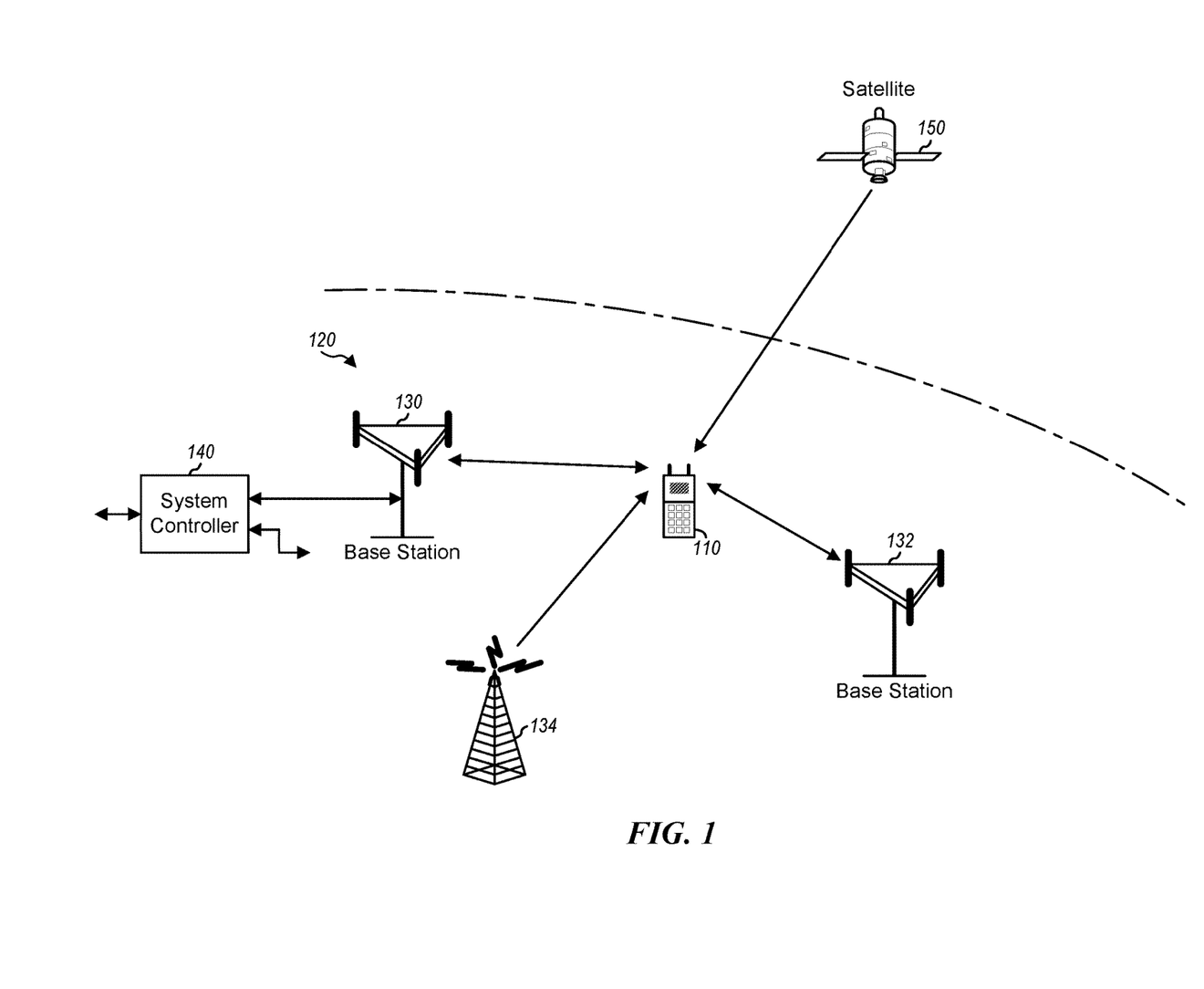
FIG. 1 shows a wireless device communicating with a wireless communication system.

FIG. 1 shows a wireless device 110 that incorporates a continuous-time delta-sigma analog-to-digital converter (CTDS ADC) for communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband-CDMA (W-CDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, W-CDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3300 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Figure 2:
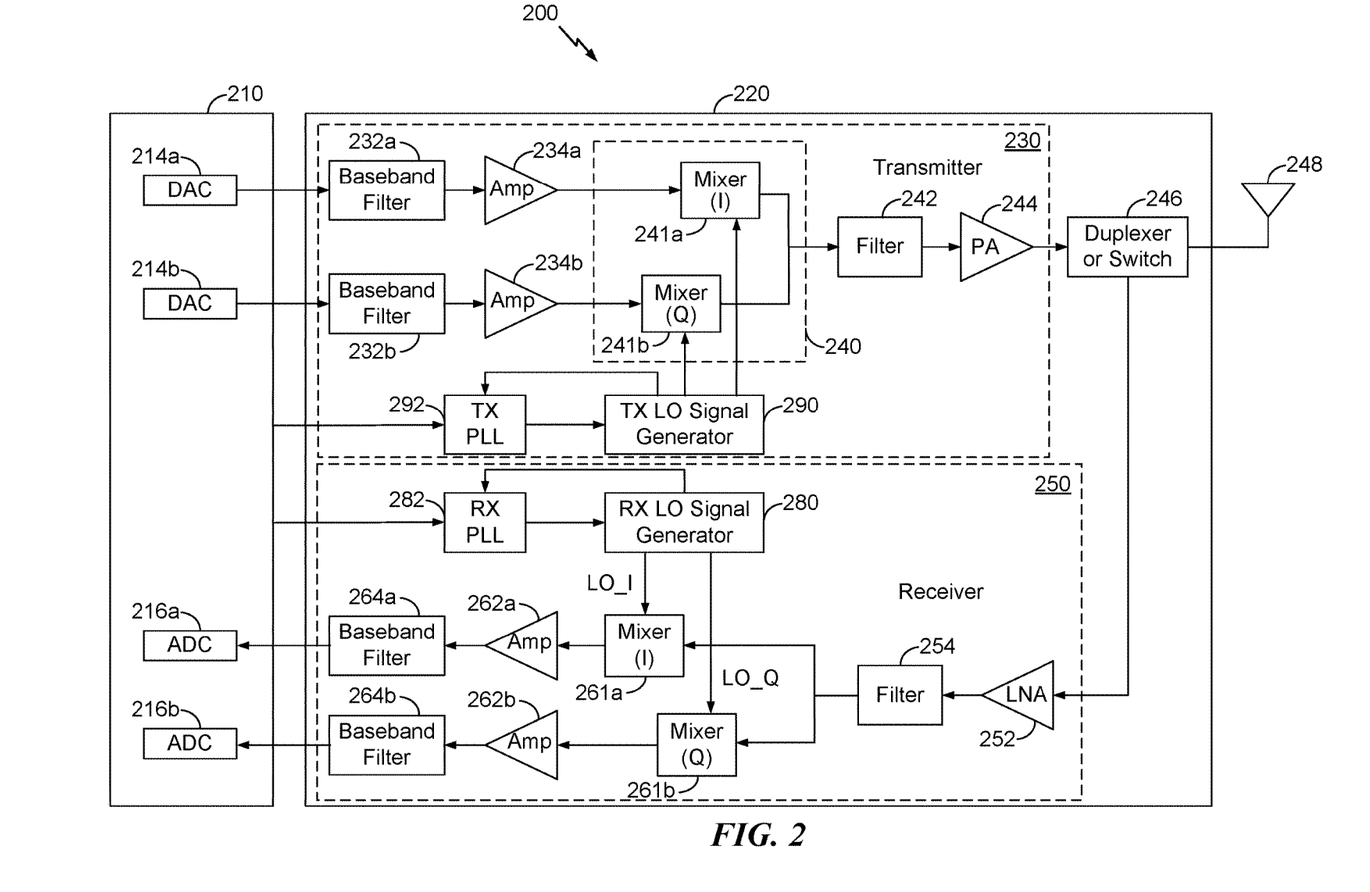
FIG. 2 shows a block diagram of the wireless device in FIG. 1, according to an aspect of the present disclosure.

FIG. 2 shows a block diagram of an exemplary design of a wireless device 200, such as the wireless device 110 shown in FIG. 1, which may incorporate a continuous-time delta-sigma analog-to-digital converter (CTDS ADC). FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214a and 214b for converting digital signals generated by the data processor 210 into the in-phase (I) and quadrature (Q) analog output signals (e.g., I and Q output currents) for further processing.

Within the transmitter 230, baseband filters 232a and 232b filter the in-phase (I) and quadrature (Q) analog transmit signals, respectively, to reduce undesired images caused by the prior digital-to-analog conversion. Amplifiers (Amp) 234a and 234b amplify the signals from baseband filters 232a and 232b, respectively, and provide in-phase (I) and quadrature (Q) baseband signals. An upconverter 240 including upconversion mixers 241a and 241b upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by baseband filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

The wireless devices of FIGS. 1 and 2 operate in a wireless communication system that transmits and receives data for two-way communication. In this process, the data signals communicated may be converted from an analog signal to a digital signal. For example, the analog-to-digital converters (ADCs) 216a and 216b are used for converting analog input signals into digital signals for further processing by the data processor 210. For example, the ADCs 216a and 216b may convert received radio frequency (RF) signals that are down-converted to baseband signals, filtered, and otherwise processed into digital signals for further signal processing by the data processor 210 in the digital domain.

Figure 3:
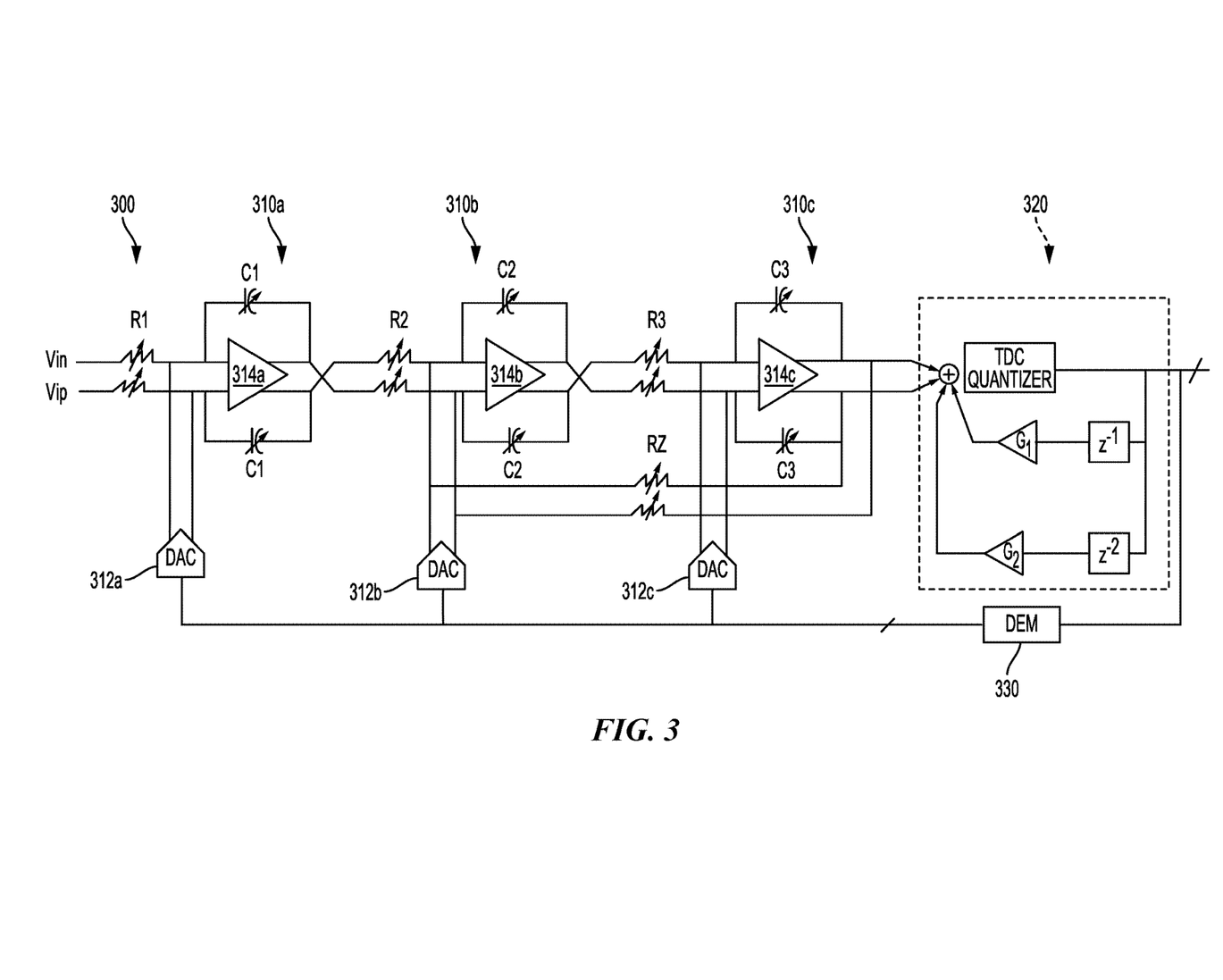
FIG. 3 illustrates a continuous-time analog-to-digital converter (CT ADC).

FIG. 3 illustrates a continuous-time analog-to-digital converter (CT ADC) 300 according to a conventional configuration. Representatively, the CT ADC 300 includes a first integrator 310a, a second integrator 310b, and a third integrator 310c. The first integrator 310a includes a first amplifier 314a coupled to a first digital-to-analog converter (DAC) 312a. Inputs of the first amplifier 314a are coupled to resistors R1, and outputs of the first amplifier 314a are coupled to capacitors C1.

The second integrator 310b includes a second amplifier 314b coupled to a second DAC 312b. Inputs of the second amplifier 314b are coupled to resistors R2, and outputs of the second amplifier 314b are coupled to capacitors C2. Similarly, the third integrator 310c includes a third amplifier 314c coupled to a third DAC 312c. Inputs of the third amplifier 314c are coupled to resistors R3, and outputs of the third amplifier 314c are coupled to capacitors C3. Resistors RZ are coupled between the outputs of the third amplifier 314c and inputs of the second amplifier 314b.

The CT ADC 300 further includes a quantizer 320. For example, the quantizer 320 is a device or algorithmic function that maps input values from a large set (e.g., a continuous set) to output values in a smaller set (e.g., countable values). The quantizer 320 is coupled to an output of the third integrator 310c.

The quantizer 320 compensates for excess loop delay (ELD). ELD compensation occurs when appropriate filter coefficients are determined to account for loop delay in the CT ADC 300. Thus, the determined filter coefficients improve performance of the CT ADC 300. A dynamic element matching (DEM) circuit 330 is coupled between an output of the quantizer 320 and inputs of each of the first DAC 312a, the second DAC 312b, and the third DAC 312c.

One drawback of the CT ADC 300 is power/frequency scaling. In particular, the power/frequency scaling of the CT ADC 300 is not as robust as discrete time (DT) ADCs. For example, a CT ADC in 28 nanometer radio frequency exhibits similar power consumption as its DT counterpart at LTE 40 bandwidth modes. Unfortunately, the CT ADC burns more than twice the power compared to the DT ADC when operating in a global system for mobile communications (GSM) bandwidth (BW) mode. This is an important distinction for CT ADCs in baseband receivers because they support multiple standards with wide bandwidth variations.

According to aspects of the present disclosure, a CT ADC may be robustly reconfigured from higher orders to lower orders, and vice versa, when switching between different standards. This allows improved power consumption for different standards because some of integrators/active components can be shut down when lower bandwidth is involved. In addition to order programmability, excess loop delay (ELD) compensation of the proposed CT ADC is programmable for improving loop stability.

Figure 4A:
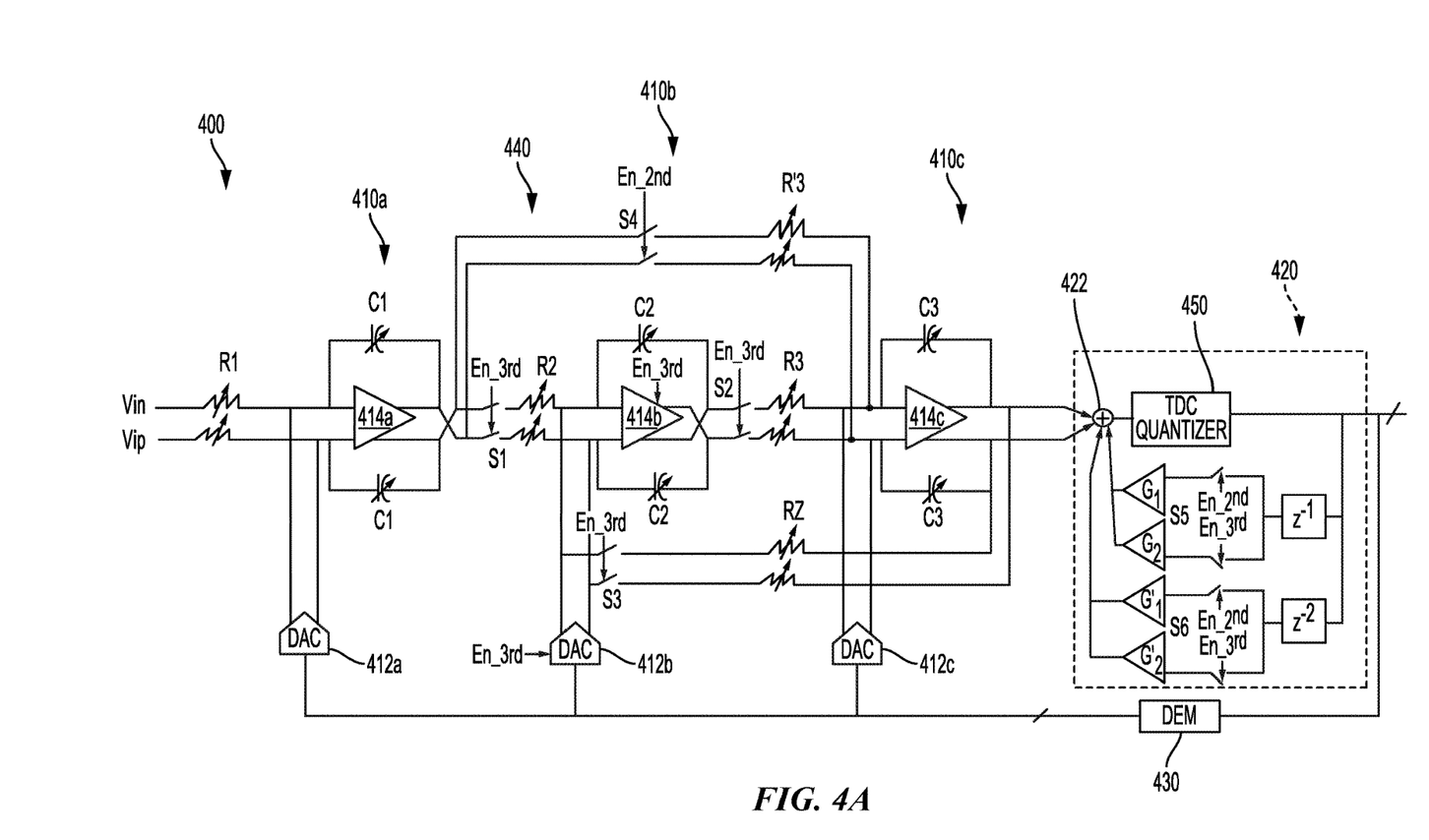
FIG. 4A illustrates a continuous-time delta-sigma analog-to-digital converter (CTDS ADC), according to aspects of the present disclosure.

FIG. 4A illustrates a continuous-time delta-sigma analog-to-digital converter (CTDS ADC) 400, according to aspects of the present disclosure. The CTDS ADC 400 may include a programmable order and excess loop delay (ELD) feedback. In this configuration, the ELD feedback is programmable based on a transfer function of the CTDS ADC. For example, the ELD may be configured for changing feedback coefficients based on the transfer function of the CTDS ADC 400.

The CTDS ADC 400 may include a first integrator 410a, a second integrator 410b, and a third integrator 410c. The CTDS ADC 400 may be configured for receiving inputs Vin and Vip at the first integrator 410a. The first integrator 410a may include a first amplifier 414a coupled to a first DAC 412a. Inputs of the first amplifier 414a may be coupled to resistors R1 (e.g., a programmable resistor). In addition, outputs of the first amplifier 414a may be coupled to capacitors C1 (e.g., a programmable capacitor). The capacitors C1 may also be coupled to inputs of the first amplifier 414a. Additionally, the CTDS ADC 400 may include a programmable transconductance amplifier and a programmable capacitor, instead of a programmable resistor and a programmable capacitor.

The second integrator 410b may include a second amplifier 414b coupled to a second DAC 412b. Inputs of the second amplifier 414b may be coupled to resistors R2, and outputs of the second amplifier 414b may be coupled to capacitors C2. The capacitors C2 may be coupled to inputs of the second amplifier 414b. The second integrator 410b may be selectively coupled/decoupled to/from the CTDS ADC 400 by switches S1 and S2. For example, switches S1 and S2 may be controlled by a control signal En_3rd.

Similarly, the third integrator 410c may include a third amplifier 414c coupled to a third DAC 412c. Inputs of the third amplifier 414c may be coupled to resistors R3. In addition, outputs of the third amplifier 414c may be coupled to capacitors C3. The capacitors C3 may be coupled to inputs of the third amplifier 414c. Switches S3 may selectively couple outputs of the third amplifier 414c to/from inputs of the second amplifier 414b. For example, switches S3 may be controlled by the control signal En_3rd. Additionally, resistors RZ (e.g., zeroing resistors) may be coupled between outputs of the third amplifier 414c and inputs of the second amplifier 414b.

According to an aspect of the present disclosure, capacitors C1-C3 are variable capacitors (e.g., programmable capacitors). Similarly, resistors R1-R3 and RZ are variable resistors (e.g., programmable resistors). According to additional aspects of the present disclosure, each DAC (e.g., 412a-412c) may include an input coupled to an output of the quantizer 420. In addition, an output of each DAC (e.g., 412a-412c) is coupled to an input of a corresponding integrator (e.g., 410a-410c).

In this aspect of the present disclosure, a bypass path 440 may be coupled between outputs of the first amplifier 414a and inputs of the third amplifier 414c. The bypass path 440 may include resistors R'3 and switches S4. In this example, resistors R'3 may be programmable. In addition, switches S4 may selectively couple/decouple the first integrator 410a to the third integrator 410c. In addition, switches S4 may be controlled by a control signal En_2nd. In operation, the bypass path 440 supports dynamic conversion of the CTDS ADC 400 to support first-order, second-order, and third-order operation.

For example, when the control signal En_2nd is enabled, the switches S1, S2, and S3 are open and the switches S4 are closed. As a result, the CTDS ADC 400 is dynamically converted from a third-order circuit to a second-order circuit. Conversely, when the control signal En_3rd is enabled, the switches S1, S2, and S3 are closed and the switches S4 are open. This dynamically converts the CTDS ADC 400 back to a third-order circuit from a second-order circuit. During conversion to/from the loop filter between second-order/third-order circuits, loop coefficients may be adjusted through capacitors C1 through C3. For example, capacitors C1 through C3 may be programmable and configured to adjust a loop coefficient based on the transfer function of the CTDS ADC 400. Additionally, the resistors R1-RZ and the DACs 412a-412c may be similarly reconfigured as well, along with the loop coefficients.

According to additional aspects of the present disclosure, the bypass path 440 may be coupled at various other locations in the CTDS ADC 400 other than between outputs of the first amplifier 414a and inputs of the third amplifier 414c. For example, the bypass path 440 may be coupled between outputs of the second amplifier 414b and outputs of the third amplifier 414c. The bypass path 440 may also be coupled between inputs of the first amplifier 414a and inputs of the second amplifier 414b. Loop coefficients may be adjusted through capacitors C1, C2, and/or C3 depending on where the bypass path 440 is located. According to an aspect of the present disclosure, the bypass path 440 may be disabled for maintaining an original transfer function of the CTDS ADC 400 when desired.

The CTDS ADC 400 may further include a quantizer 420. The quantizer 420 may include a summer 422, a time-to-digital converter (TDC) circuit (e.g., TDC quantizer circuit 450), and multiple delay elements $z^{-1}$ through $z^{-2}$. For example, the TDC quantizer circuit 450 may be a successive approximation register (SAR) quantizer, or any other appropriate quantizer. Delay element $z^{-1}$ may be coupled to gain elements $G_1$, $G_2$ through switches S5 controlled by control signals En_2nd and En_3rd. Delay element $z^{-2}$ may be coupled to gain elements $G'_1$ $G'_2$ through switches S6 controlled by control signals En_2nd and En_3rd. An output of the CTDS ADC 400 loop filter and the delay elements may be summed at the summer 422 and input into the TDC quantizer circuit 450.

The quantizer 420 may be coupled to outputs of the third integrator 410c. The quantizer 420 may include excess loop delay (ELD) compensation for improving loop stability. A dynamic element matching (DEM) circuit 430 may be coupled between an output of the quantizer 420 and inputs of each of the first DAC 412a, the second DAC 412b, and the third DAC 412c. According to an aspect of the present disclosure, a number of ELD compensation feedback paths depends on a loop order, a number of integrators used and their corresponding bandwidths, and a latency of the quantizer 420, the DEM 430, and the delay elements $z^{-1}$ through $z^{-2}$.

During conversion to/from the second-order/third-order circuits, local feedback coefficients may be adjusted through the quantizer 420. For example, when the signals En_2nd are transmitted, the CTDS ADC 400 is dynamically reconfigured to a second-order circuit from a third-order circuit. The delay elements $z^{-1}$ through $z^{-2}$ are then selectively coupled to the gain elements through switches S5 and S6. Additionally, the switches corresponding to control signal En_2nd in switches S5 and S6 are closed. According to an aspect of the present disclosure, the DACs (e.g., 412a-412c) may be configured for bypassing or disabling based on the transfer function of the CTDS ADC 400.

Figure 4B:
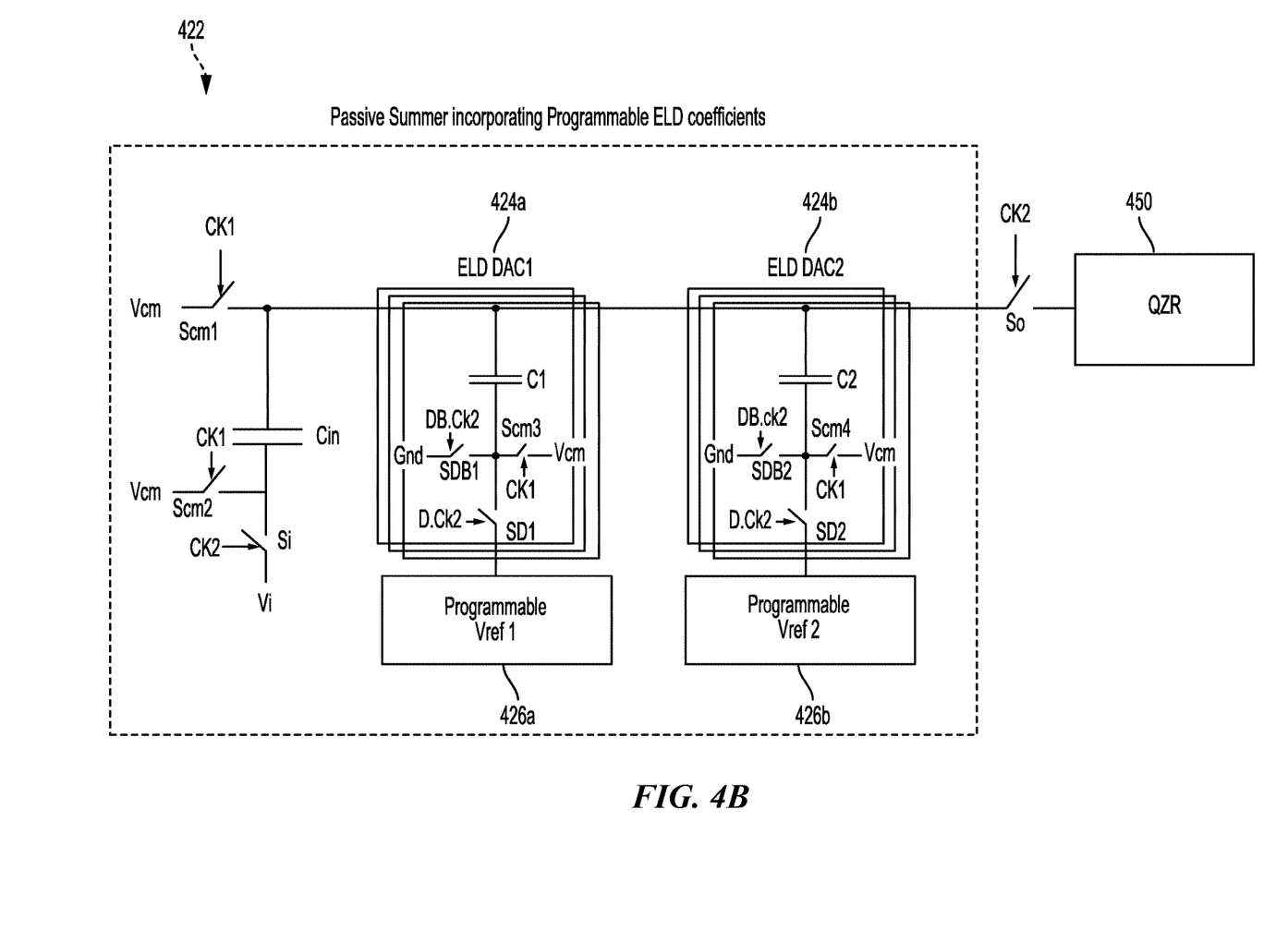
FIG. 4B illustrates an exemplary summer of the continuous-time delta-sigma analog-to-digital converter (CTDSM ADC) of FIG. 4A, according to aspects of the present disclosure.

FIG. 4B illustrates a summer 422 of the continuous-time delta-sigma analog-to-digital converter (CTDS ADC) 400 of FIG. 4A, according to aspects of the present disclosure.

The summer 422 (e.g., a passive summer) may include a first excess loop delay (ELD) DAC 424a and a second ELD DAC 424b (e.g., multiple ELD paths). The first ELD DAC 424a and the second ELD DAC 424b may be coupled to a time-to-digital converter (TDC) quantizer circuit 450. The summer 422 may receive as inputs common mode voltages Vcm and voltage Vi. According to an aspect of the present disclosure, voltage Vi is the output of the CTDS ADC 400. A first clock signal CK1 may control common mode switches $S_{cm1}$ and $S_{cm2}$, and a second clock signal CK2 may control the input switch Si. The capacitor Cin may be coupled to a voltage Vi to sample an output of the CTDS ADC 400 (e.g., CTDS ADC loop filter). The summer 422 may also be switchably coupled to the TDC quantizer circuit 450 through the switch So. According to additional aspects of the present disclosure, more ELD DACs may be included for higher orders of CTDS ADCs. For example, the ELD paths may be reconfigurable.

The first ELD DAC 424a may include a first programmable Vref 426a coupled to a first capacitor C1 via a switch $S_{D1}$. A common mode voltage Vcm may be coupled to the first capacitor C1 via a switch $S_{cm3}$. A ground may be coupled to the first capacitor C1 via a switch $S_{DB1}$.

Similarly, the second ELD DAC 424b may include a second programmable Vref 426b coupled to a second capacitor C2 via a switch $S_{D2}$. The common mode voltage Vcm may be coupled to the second capacitor C2 via a switch $S_{cm4}$. Ground may be coupled to the second capacitor C2 via a switch $S_{DB2}$. The first programmable Vref 426a and the second programmable Vref 426b may be configured to change the gain elements $G_1$, $G_2$, $G'_1$, and $G'_2$. For example, gain elements $G_1$ and $G_2$ may be supplied to the summer 422 through the first programmable Vref 426a, and gain elements $G'_1$ and $G'_2$ may be supplied to the summer 422 through the second programmable Vref 426b. In this way, changing the first programmable Vref 426a may change gain elements $G_1$ and $G_2$, and changing the second programmable Vref 426b may change gain elements $G'_1$ and $G'_2$. A capacitor ratio between the first ELD DAC 424a and the second ELD DAC 424b may be improved for matching.

According to an aspect of the present disclosure, the switches $S_{D1}$ and $S_{D2}$ may be controlled by a clock signal D.Ck2. The switches $S_{DB1}$ and $S_{DB2}$ may be controlled by a clock signal DB.Ck2. The clock signal D.Ck2 may be a combination of data and a second clock signal CK2. In addition, the clock signal DB.Ck2 may be a combination of data bar and the second clock signal CK2.

Figure 4C:
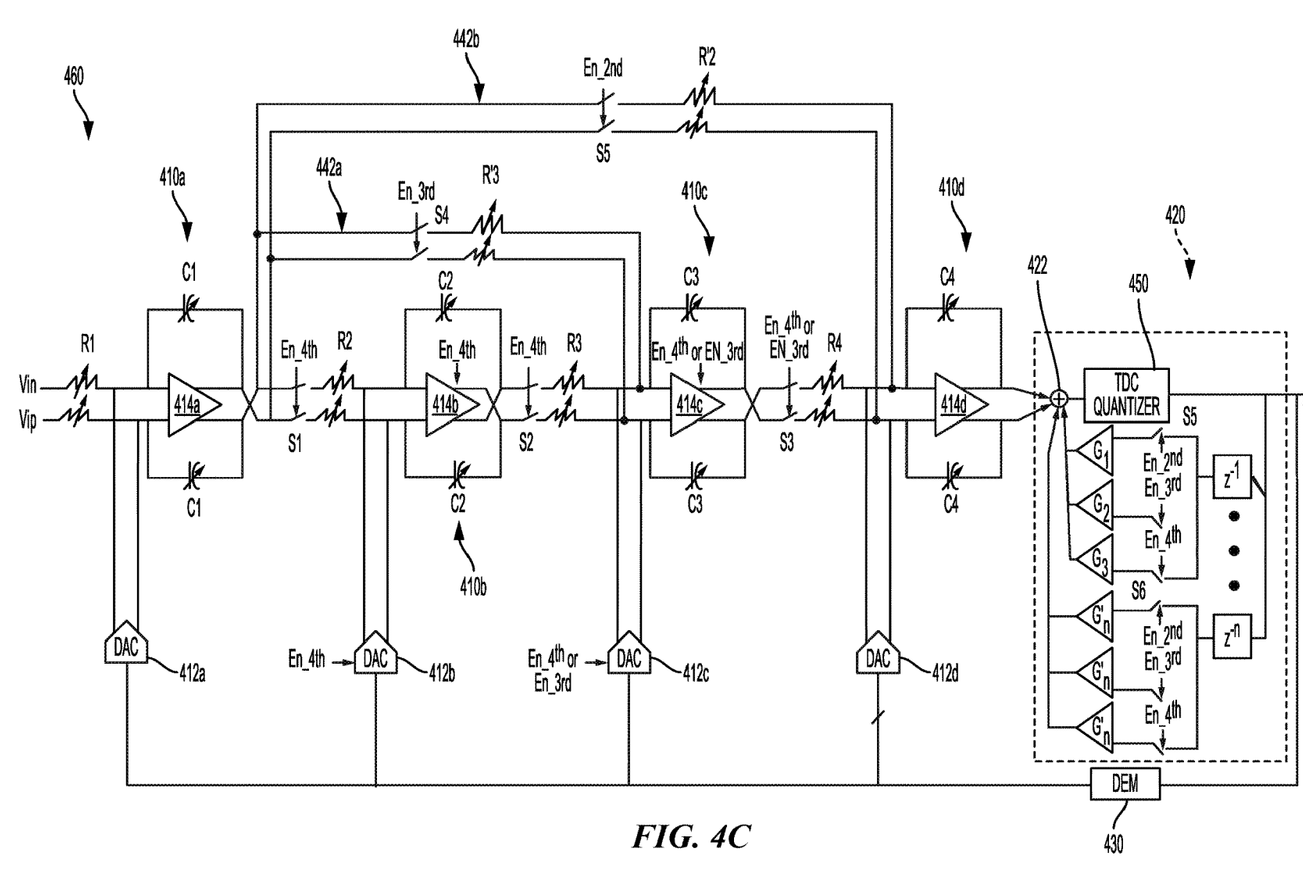
FIG. 4C illustrates a continuous-time delta-sigma analog-to-digital converter (CTDSM ADC), according to aspects of the present disclosure.

FIG. 4C illustrates a continuous-time delta-sigma analog-to-digital converter (CTDS ADC) 460, according to aspects of the present disclosure. The CTDS ADC 460 may include a programmable order and excess loop delay (ELD) feedback and may be substantially similar to the CTDS ADC 400 of FIG. 4A. The ELD may be programmable based on a transfer function of the CTDS ADC.

The CTDS ADC 460 may include a first integrator 410a, a second integrator 410b, a third integrator 410c, and a fourth integrator 410d. Each integrator (e.g., 410a-410d) may include corresponding amplifiers (e.g., 414a-414d, resistors R1-R4), capacitors C1-C4 (e.g., capacitor banks), and DACs (e.g., 412a-412d) coupled in a similar manner as described in FIG. 4A regarding the CTDS ADC 400. According to an aspect of the present disclosure, the capacitors C1-C4 are variable capacitors (e.g., varactors).

The CTDS ADC 460 may also include switches S1 coupled between outputs of the first amplifier 414a and inputs of the second amplifier 414b. The switches S2 may be coupled between outputs of the second amplifier 414b and inputs of the third amplifier 414c. The switches S3 may be coupled between outputs of the third amplifier 414c and inputs of the fourth amplifier 414d.

The CTDS ADC 460 may further include a first bypass path 442a and a second bypass path 442b. The first bypass path 442a may include switches S4 and resistors R'3. The first bypass path 442a may be coupled between outputs of the first amplifier 414a and inputs of the third amplifier 414c. The second bypass path 442b may include switches S5 and resistors R'2. The second bypass path 442b may be coupled between outputs of the first amplifier 414a and inputs of the fourth amplifier 414d.

The first bypass path 442a may convert the CTDS ADC 460 from a fourth-order circuit to a third-order circuit. For example, in response to control signals En_3rd, switches S1, S2, and S5 are opened, and switches S3 and S4 are closed. As a result, the second integrator 410b is skipped. The CTDS ADC 460 is converted to a second-order circuit in response to the control signals En_2nd. This closes the switches S5 and opens the switches S1-S4. As a result, the second integrator 410b and the third integrator 410c are skipped. When operating as a fourth-order circuit, switches S1-S3 are closed and switches S4 and S5 are open. During conversion to/from the second-order/third-order/fourth-order circuits, loop coefficients may be adjusted through capacitors C1, C3, and C4 and resistors R1 through R4. According to an aspect, the first bypass path 442a and the second bypass path 442b may be disabled for maintaining an original transfer function of the CTDS ADC 460.

The CTDS ADC 460 may further include a quantizer 420. The quantizer 420 may include a summer 422, a TDC quantizer circuit 450, and multiple delay elements $z^{-1}$ through $z^{-n}$. Delay element $z^{-1}$ may be coupled to gain elements $G_1$, $G_2$, $G_3$, through switches S6 controlled by control signals En_2nd, En_3rd, and En_4th. Delay element $z^{-n}$ may be coupled to gain elements $G'_1$, $G'_2$, $G'_n$, through switches S7 controlled by control signals En_2nd, En_3rd, and En_4th. An output of the CTDS ADC 460, the TDC quantizer circuit 450, and the delay elements may be summed at the summer 422.

The quantizer 420 may be coupled to outputs of the fourth integrator 410d. The quantizer 420 may be for excess loop delay (ELD) compensation for improving loop stability. A dynamic element matching (DEM) circuit 430 may be coupled between an output of the quantizer 420 and inputs of each of the DACs (e.g., 412a-412d).

During conversion to/from the second-order/third-order/fourth-order circuits, local feedback coefficients may be adjusted through the quantizer 420. For example, the CTDS ADC 460 is reconfigured to a second-order circuit from a third-order/fourth-order circuit in response to the control signals En_2nd. The delay elements $z^{-1}$ through $z^{-n}$ are then selectively coupled to the gain elements through switches S6 and S7. Additionally, the switches corresponding to the control signal En_2nd in switches S6 and S7 are closed.

Similarly, for a third-order circuit, the control signal En_3rd and the switches corresponding to control signal En_3rd in switches S6 and S7 are closed to selectively couple delay elements $z^{-1}$ through $z^{-n}$ to the gain elements. Reconfiguring of the CTDS ADC 460 may also be extended to cases with multiple ELD feedbacks. According to an aspect of the present disclosure, the DACs (e.g., 412a-412d) may be configured for bypassing based on the transfer function of the CTDS ADC 460.

According to additional aspects of the present disclosure, the first bypass path 442a and the second bypass path 442b may be coupled at various locations in the CTDS ADC 460. For example, the first bypass path 442a may be coupled between outputs of the second amplifier 414b and inputs of the fourth amplifier 414d. The first bypass path 442a may also be coupled between inputs of the first amplifier 414a and inputs of the second amplifier 414b. The first bypass path 442a may also be coupled between outputs of the third amplifier 414c and outputs of the fourth amplifier 414d. The bypass paths may or may not include a programmable resistor depending on the transfer function.

Similarly, the second bypass path 442b may be coupled between inputs of the first amplifier 414a and inputs of the third amplifier 414c. The second bypass path 442b may also be coupled between outputs of the second amplifier 414b and outputs of the fourth amplifier 414d. Loop coefficients may be adjusted through capacitors C1, C2, C3, and/or C4 and R1 through R4 depending on where the first bypass path 442a and the second bypass path 442b are located. The switches S1-S5 may also be controlled by the control signals En_2nd, En_3rd, and En_4th as appropriate for configuration as a second-order, third-order, or fourth-order circuit.

According to aspects of the present disclosure, the CTDS ADC 400 and the CTDS ADC 460 may include more or fewer integrators than what is illustrated in FIGS. 4A and 4C. For example, the CTDS ADCs (e.g., 400, 460) may include two integrators or more. The CTDS ADCs (e.g., 400, 460) may include additional bypass paths controlled by corresponding control signals for accommodating reconfiguration of a higher order circuit to/from a lower order circuit, and vice versa.

According to aspects of the present disclosure, the CTDS ADCs (e.g., 400, 460) may include a feedback loop, a feedforward loop, or a combination of feedback and feedforward loops. For example, the CTDS ADC 400 and the CTDS ADC 460 may include a single loop or a multi-loop cascaded topology. For example, a loop may include any feedback path including the DACs. A single loop may include one feedback loop including an output of the quantizer 450, any of the DACs, and any of the integrators. A multi-loop may include multiple loops through any of the DACs and any of the integrators as described herein.

According to additional aspects of the present disclosure, the CTDS ADC 400 and the CTDS ADC 460 may be configured for processing single-ended or differential signals. According to aspects of the present disclosure, using a particular radio communications protocol (e.g., a wireless standard) may determine the transfer function of the CTDS ADC 400 and the CTDS ADC 460. For example, some wireless standards use higher order loop filters for the CTDS ADC 400 and the CTDS ADC 460, and other wireless standards use lower order loop filters for the CTDS ADC 400 and the CTDS ADC 460.

Advantages of the CTDS ADC 400 and the CTDS ADC 460 include power scaling of the CTDS ADC 400 and the CTDS ADC 460 for supporting multiple RF standards. For example, power scaling is improved by shutting down some active components (e.g., integrators, DACs) and reconfiguring the CTDS ADC in a lower order when supporting lower signal bandwidths (e.g., global system for mobile communications (GSM) mode). Accurate implementation of each of the reconfigurable modes is supported by independently programming ELD coefficients as well as programmable capacitor banks for the integrator coefficients.

Additionally, reconfiguring the CTDS ADC 400 and the CTDS ADC 460 helps reduce a capacitor area in low bandwidth modes. This is because conventional feedback capacitors included in CTDS ADCs are larger due to lower frequencies of low bandwidth modes, such as GSM. Reconfiguring the CTDS ADC 400 and the CTDS ADC 460 allows for programming of the CTDS ADCs in a lower order for low bandwidth modes and involves smaller coefficients.

Figure 5:
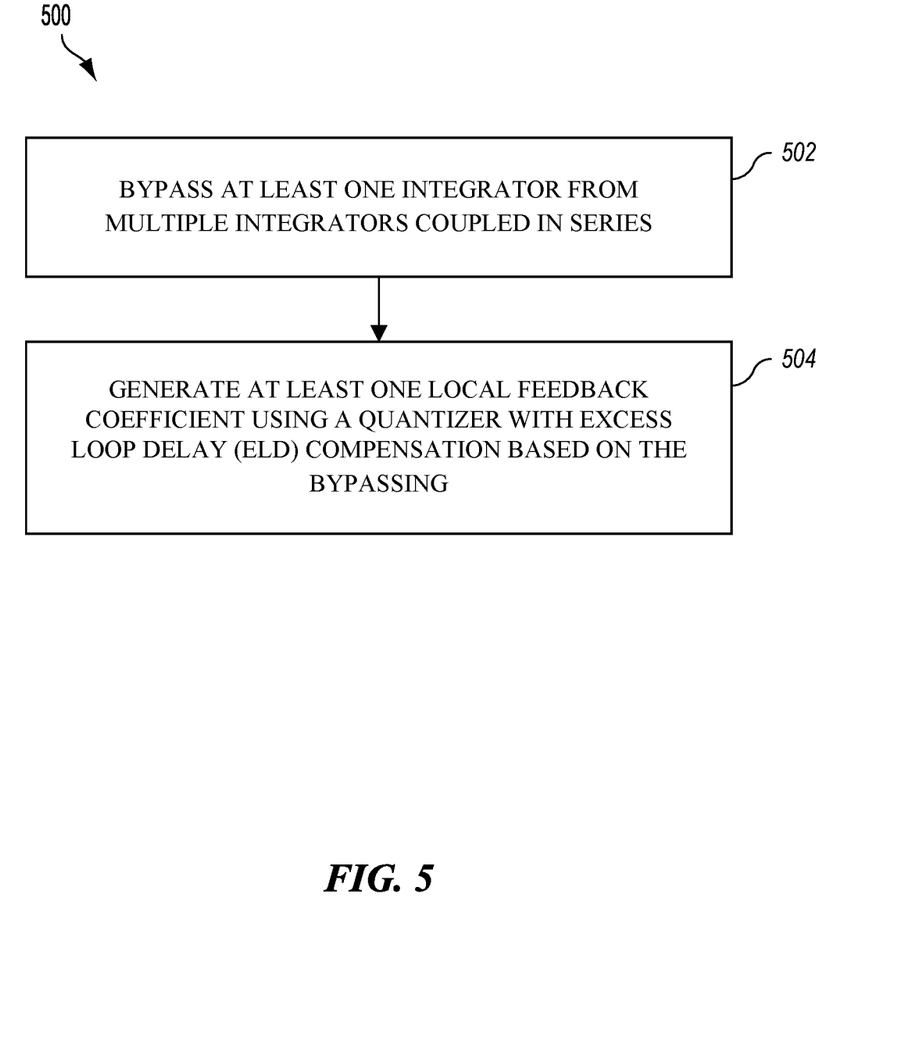
FIG. 5 depicts a simplified flowchart of a method for generating a transmit signal, according to aspects of the present disclosure.

FIG. 5 depicts a simplified flowchart of a method 500 of generating a transmit signal, according to aspects of the present disclosure. At block 502, at least one integrator is bypassed from multiple integrators coupled in series. For example, as shown in FIGS. 4A and 4C, bypass paths (e.g., 440, 442a, and 442b) may be configured to bypass at least one of the integrators (e.g., 410a-410d).

At block 504, at least one local feedback coefficient is generated using a quantizer with excess loop delay (ELD) compensation based on the bypassing. For example, as shown in FIG. 4C, multiple delay elements $z^{-1}$ through $z^{-n}$ may be coupled to gain elements $G_1$, $G_2$, $G_3$, through switches S5 controlled by control signals En_2nd, En_3rd, and En_4th. The delay element $z^{-n}$ may be coupled to gain elements $G'_1$, $G'_2$, through switches S6 controlled by control signals En_2nd, En_3rd, and En_4th.

According to additional aspects, the method 500 may further include bypassing at least one digital-to-analog converter (DAC). For example, as shown in FIGS. 4A and 4C, at least one DAC (e.g., 412a-412d) may be bypassed. The bypassed DAC may be coupled to at least one bypassed integrator (e.g., 410a-410d). The method 500 may also include generating updated feedback coefficients based on the bypassing at block 502.

According to an aspect of the present disclosure, a continuous-time delta-sigma analog-to-digital converter (CTDS ADC) is described. In one configuration, the CTDS ADC includes means for integrating. The integrating means may be any of the integrators (e.g., 410a-410d) shown in FIGS. 4A and 4C. In one configuration, the CTDS ADC includes means for quantizing. The quantizing means may be the quantizer 420 as shown in FIGS. 4A and 4C. In one configuration, the CTDS ADC includes means for converting. The converting means may be any of the digital-to-analog converters (DACs) 412a-412d as shown in FIGS. 4A and 4C. In one configuration, the CTDS ADC includes means for bypassing. The bypassing means may be the bypass path 440 as shown in FIG. 4A and bypass paths (e.g., 442a and 442b) shown in FIG. 4C. In another aspect, the aforementioned means may be any module or any apparatus or material configured to perform the functions recited by the aforementioned means.

Figure 6:
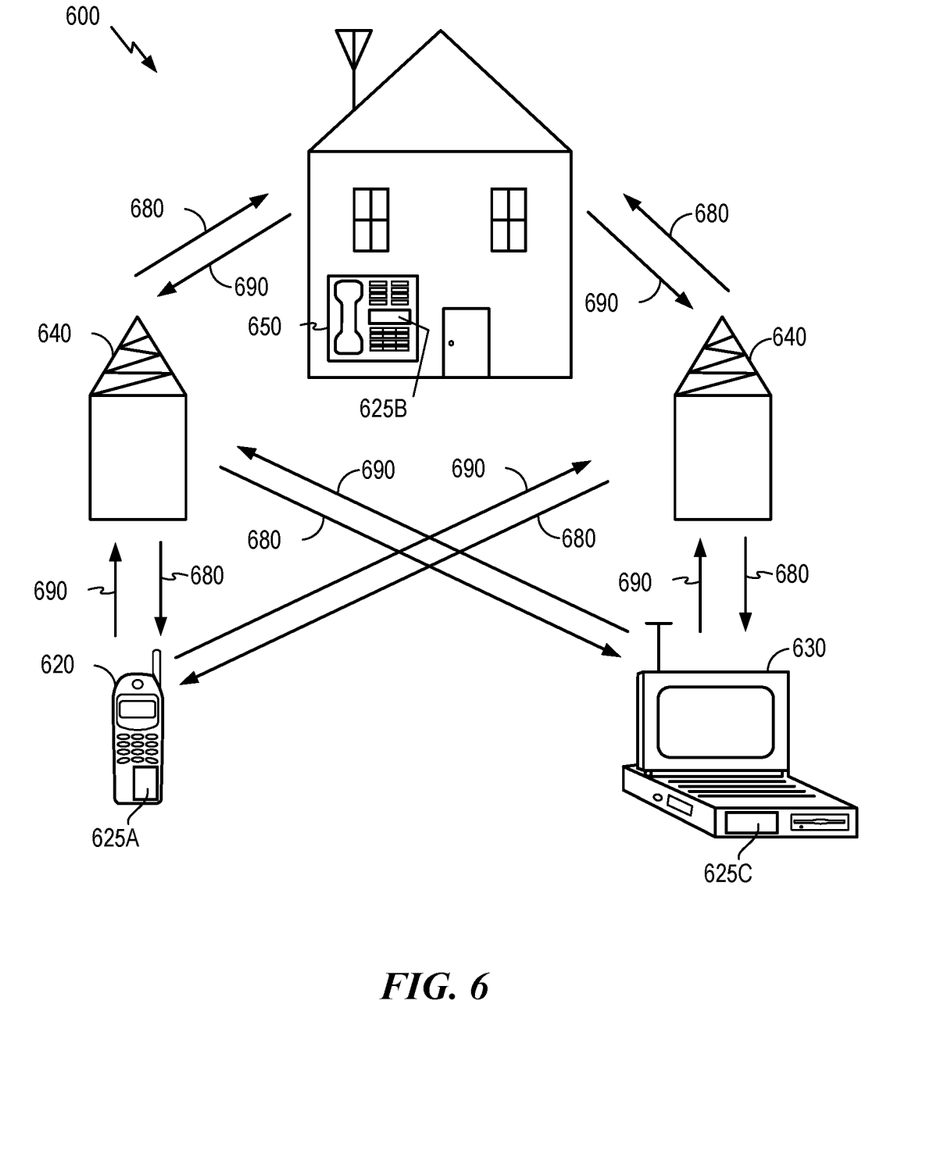
FIG. 6 is a block diagram showing an exemplary wireless communication system in which a configuration of the disclosure may be advantageously employed.

FIG. 6 is a block diagram showing an exemplary wireless communication system in which a configuration of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 624A, 624B, and 624C that include the disclosed CTDS ADC device. It will be recognized that other devices may also include the disclosed ADC device, such as the base stations, switching devices, and network equipment. FIG. 6 shows forward link signals 680 from the base station 640 to the remote units 620, 630, and 650 and reverse link signals 690 from the remote units 620, 630, and 650 to base station 640.

In FIG. 6, remote unit 620 is shown as a mobile telephone, remote unit 630 is shown as a portable computer, and remote unit 650 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the ADC device.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus.

For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill in the art would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic device, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. Storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A continuous-time analog-to-digital converter (ADC), comprising:
   a plurality of integrators selectively coupled in series;
   a quantizer with excess loop delay (ELD) compensation coupled in series to a least one of the plurality of integrators, the ELD compensation being programmable based on a transfer function of the ADC;
   a plurality of parallel digital-to-analog converters (DACs), each having an input coupled to an output of the quantizer, and an output coupled to an input of a corresponding integrator; and
   at least one bypass path coupled to an input or output of one of the plurality of integrators, the at least one bypass path configured to selectively bypass one or more of the plurality of integrators to change the transfer function of the ADC.

2. The ADC of claim 1, in which the at least one bypass path includes a plurality of switches.

3. The ADC of claim 1, in which the ADC comprises a feedback loop, a feedforward loop, or a combination of feedback and feedforward loops.

4. The ADC of claim 1, in which the ELD compensation is configured to change feedback coefficients based on the transfer function of the ADC.

5. The ADC of claim 1, in which the ADC comprises a single loop.

6. The ADC of claim 1, in which the ADC comprises a multi-loop cascaded topology.

7. The ADC of claim 1, further comprising a summer coupled between the plurality of integrators and the quantizer, the summer comprising a plurality of ELD paths.

8. The ADC of claim 1, in which using a particular radio communications protocol determines the transfer function of the ADC.

9. The ADC of claim 1, in which each integrator comprises a programmable resistor and a programmable capacitor, the programmable capacitor and resistor configured to adjust a loop coefficient based on the transfer function of the ADC.

10. The ADC of claim 1, in which each integrator comprises a programmable transconductance amplifier and a programmable capacitor, the programmable transconductance amplifier and capacitor configured to adjust a loop coefficient based on the transfer function of the ADC.

11. The ADC of claim 1, in which the quantizer comprises a plurality of delay elements, each of the plurality of delay elements switchably coupled to a plurality of gain elements based on the transfer function of the ADC.

12. A method of generating a signal from a continuous-time delta-sigma analog-to-digital converter (CTDS ADC), comprising:
   bypassing at least one of a plurality of integrators coupled in series; and
   generating at least one local feedback coefficient using a quantizer with excess loop delay (ELD) compensation based on the bypassing.

13. The method of claim 12, further comprising bypassing at least one digital-to-analog converter (DAC) of a plurality of DACs, the at least one DAC coupled to the at least one of the plurality of integrator.

14. The method of claim 12, further comprising reprogramming at least one of a plurality of digital-to-analog converters (DACs) based on the bypassing.

15. The method of claim 12, further comprising generating an updated loop coefficient based on the bypassing.

16. The method of claim 12, further comprising generating updated feedback coefficients based on the bypassing.

17. A continuous-time analog-to-digital converter (ADC), comprising:
   means for integrating coupled in series;
   means for quantizing with excess loop delay (ELD) compensation coupled in series to the integrating means, the quantizing means programmable based on a transfer function of the ADC;
   means for converting, the converting means coupled to the quantizing means and the integrating means; and
   means for bypassing coupled to the integrating means, the bypassing means configured to selectively bypass some of the integrating means to change the transfer function of the ADC.

18. The ADC of claim 17, in which the ADC comprises a feedback loop, a feedforward loop, or a combination of feedback and feedforward loops.

19. The ADC of claim 17, in which the quantizing means is configured to change feedback coefficients based on the transfer function of the ADC.

20. The ADC of claim 17, in which the ADC comprises a single loop.

21. The ADC of claim 17, in which the ADC comprises a multi-loop cascaded topology.

22. The ADC of claim 17, in which the converting means are configured to be bypassed based on the transfer function of the ADC.

23. The ADC of claim 17, in which using a particular radio communications protocol determines the transfer function of the ADC.

* * * * *